United States Patent

Huang et al.

Patent Number: 6,133,086
Date of Patent: Oct. 17, 2000

[54] FABRICATION METHOD OF A TANTALUM PENTOXIDE DIELECTRIC LAYER FOR A DRAM CAPACITOR

[75] Inventors: Kuo-Tai Huang, Hsinchu; Tri-Rung Yew, Hsinchu Hsien, both of Taiwan

[73] Assignee: United Microelectronics Corp., Hsinchu, Taiwan

[21] Appl. No.: 09/339,154

[22] Filed: Jun. 24, 1999

[51] Int. Cl.$^7$ .................. H01L 21/8242; H01L 21/20; H01L 21/31; H01L 21/469; H01L 27/108

[52] U.S. Cl. .................. 438/240; 257/310; 438/785; 438/239; 438/393; 438/396

[58] Field of Search .................. 438/240, 785, 438/239, 778, 393, 396; 257/310

[56] References Cited

U.S. PATENT DOCUMENTS

| | | | |
|---|---|---|---|
| 5,374,578 | 12/1994 | Patel et al. | 437/52 |
| 5,440,157 | 8/1995 | Imai et al. | 257/310 |
| 5,468,687 | 11/1995 | Carl et al. | 437/235 |
| 5,677,015 | 10/1997 | Hasegawa | 427/576 |

*Primary Examiner*—Wael Fahmy
*Assistant Examiner*—Neal Berezny
*Attorney, Agent, or Firm*—Thomas, Kayden, Horstemeyer & Risley

[57] ABSTRACT

A method of fabricating a dielectric layer for a dynamic random access memory capacitor is described in which a tantalum pentoxide layer is deposited on the polysilicon storage electrode, followed by a two-step treatment on the tantalum pentoxide layer. The first treatment step includes a remote oxygen plasma or an ultraviolet-ozone treatment, followed by a spike annealing second treatment step.

12 Claims, 1 Drawing Sheet

FABRICATION METHOD OF A TANTALUM PENTOXIDE DIELECTRIC LAYER FOR A DRAM CAPACITOR

BACKGROUND OF THE INVENTION

1. Field of the Invention

The present invention relates to a fabrication method of a dielectric layer for a Dynamic Random Access Memory (DRAM) capacitor. More particularly, the present invention relates to a fabrication method for a tantalum pentoxide ($Ta_2O_5$) dielectric film layer.

2. Description of the Related Art

A single transistor DRAM cell is, in general, formed with a metal oxide semiconductor (MOS) transistor and a capacitor. The capacitor is the signal storage center for a DRAM cell, in which 1 bit of data is stored by a charge stored therein. As the amount of charge being stored by the capacitor is increased, the effect of noise on a reading amplifier in the information reading is greatly reduced. The "refresh" frequency is also further reduced. Increasing the charge storage capacity of a capacitor is generally accomplished by the following methods. Increasing the area of the capacitor increases the amount of charge capable of being stored by the capacitor; however, such an increase also lowers the integration of a DRAM device. Reducing the thickness of the dielectric layer also increases the capacitance of the capacitor. The material properties of the dielectric layer and the current manufacturing technique, however, require a minimum thickness of the dielectric layer. Substituting a high dielectric constant material for the dielectric layer is another approach to increasing the charge storage capacity per unit area of the capacitor.

The dielectric constant of tantalum pentoxide is approximately as high as 25, tantalum pentoxide is thereby gradually replacing oxide-nitride-oxide (ONO) as the dielectric film layer. The tantalum pentoxide dielectric film layer is conventionally deposited by chemical vapor deposition. Such a tantalum pentoxide dielectric film layer, however, poses a serious problem of charge loss, which then requires a thermal treatment in an oxygen atmosphere at a temperature of 750 to 800° C. During the thermal treatment, silicon oxide is, however, formed at the interface of the tantalum pentoxide film layer and the polysilicon storage electrode, which reduces the dielectric constant of the dielectric layer for the entire capacitor. As a result, a tantalum pentoxide dielectric film layer using the current manufacturing method cannot reach a dielectric constant of 25.

A conventional approach in resolving the above problem is to conduct a nitride reaction on the finished polysilicon storage electrode surface, followed by a deposition of tantalum pentoxide. A thermal treatment in an oxygen atmosphere further improves the quality of the tantalum pentoxide. Although silicon nitride (SiN) or silicon nitric oxide (SiON) is already formed on the surface of the polysilicon storage electrode after the nitride reaction, silicon oxide is still formed at the interface of the polysilicon storage electrode and the tantalum pentoxide layer.

Another approach to mitigate the above problem in the conventional practice is to deposit tantalum pentoxide on the polysilicon storage electrode, followed by conducting a two-step treatment on the tantalum pentoxide. First, an ultraviolet light-ozone treatment ($UV-O_3$) is conducted at a temperature of 300 to 450° C. to remove the carbon impurities in the tantalum pentoxide. The $UV-O_3$ treatment also prevents the formation of silicon oxide on the polysilicon storage electrode surface. After which, a thermal treatment is conducted at an even higher temperature of 700 to 800° C. to convert tantalum pentoxide from a non-crystalline state to a crystalline state in order to improve the current leakage problem. During this treatment step, however, the formation of silicon oxide on the polysilicon storage electrode surface is still inevitable.

SUMMARY OF THE INVENTION

The current invention provides a fabrication method of a dielectric film layer for a DRAM capacitor in which the polysilicon storage electrode is deposited with a tantalum pentoxide dielectric film layer, followed by a two-step treatment conducted on the tantalum pentoxide dielectric film layer. The first treatment step includes a remote oxygen plasma treatment or an ultraviolet light-ozone treatment, followed by a second treatment step of a spike annealing operation.

According to the preferred embodiment of the present invention, the tantalum pentoxide dielectric film layer is formed by methods including chemical vapor deposition. In order to increase the purity and the dielectric constant of the tantalum pentoxide dielectric film layer, and to prevent the current leakage problem, a two-step treatment process is performed after completing the deposition of the tantalum pentoxide dielectric film layer. The first step is a remote oxygen plasma treatment conducted at approximately 350 to 500° C. for about 30 to 120 seconds. If the first step is an $UV-O_3$ treatment, the process is conducted at approximately 300 to 400° C. The second step is a spike annealing operation, conducted in an oxygen or a nitrous oxide environment at about 1000 to 1200° C. for a duration of approximately 1 to 2 seconds. The temperature for the second treatment step is ramped at a rate of approximately 50 to 250° C. per second.

Since the temperature in the first treatment step is lower and the required duration for the second treatment step is very short, the thermal budget of the manufacturing process is reduced. Furthermore, the silicon oxide formed on the polysilicon storage electrode surface is negligible; the dielectric constant of a tantalum pentoxide dielectric film layer manufactured according to the present invention can therefore be as high as 25.

It is to be understood that both the foregoing general description and the following detailed description are exemplary, and are intended to provide further explanation of the invention as claimed.

BRIEF DESCRIPTION OF THE DRAWINGS

The accompanying drawings arc included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

Figure 1:
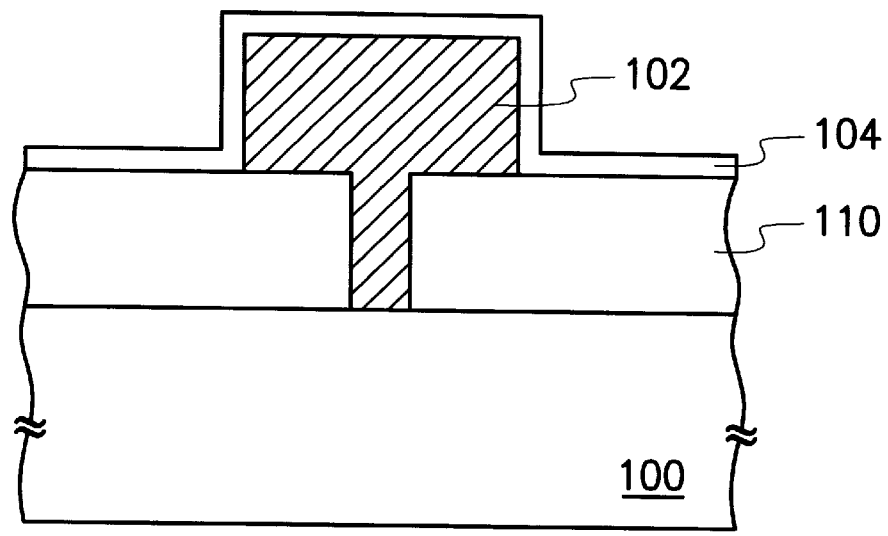
FIG. 1 is a schematic, cross-sectional view of a part of a DRAM capacitor according to the preferred embodiment of the present invention.

FIG. 1 is a schematic cross-sectional view of a part of a DRAM capacitor according to the preferred embodiment of the current invention.

Referring to FIG. 1, a substrate 100, for example, a semiconductor silicon substrate, is provided. A polysilicon storage electrode 102 is formed on the substrate. The polysilicon storage electrode 102 of a simple columnar capacitor is used as an example for the current embodiment. The insulation layer, for example, a silicon oxide layer, is indicated by reference number 110 in the Figure. A conformal tantalum pentoxide dielectric layer 104 is then deposited over the polysilicon storage electrode 102 by methods including chemical vapor deposition.

Figure 2:
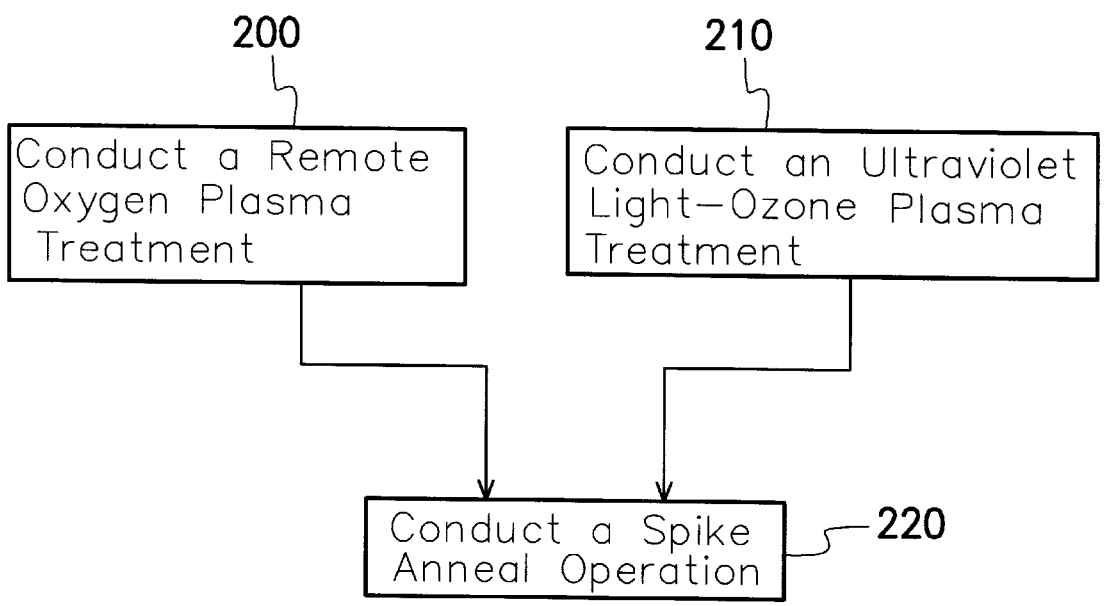
FIG. 2 is a flow chart showing the treatment process of a tantalum pentoxide dielectric layer according to the preferred embodiment of the present invention.

In the present invention, a two-step treatment, as shown in FIG. 2, is first conducted on the deposited tantalum pentoxide dielectric layer 104 before an upper electrode of the capacitor is formed.

The first treatment step of the tantalum pentoxide dielectric layer 104 includes performing step 200 in which a remote oxygen plasma operation is performed at a temperature of about 350 to 500° C. for approximately 30 to 120 seconds. Since the plasma generated in the remote oxygen plasma is composed mostly of neutral oxygen atoms O* in an excited state, the plasma reaction chamber contains no charged ions. The neutral oxygen atoms O* are able to diffuse into the tantalum pentoxide dielectric layer 104 to form chemical compounds such as CO, $CO_2$, and $H_2O$. Consequently, these compounds are released from the tantalum pentoxide dielectric layer to improve the purity of the tantalum pentoxide. The current tantalum pentoxide dielectric layer 104 is, however, still in a non-crystalline state.

The first treatment step 200 can be replaced by the treatment step 210, in which an ultraviolet light-ozone plasma treatment is conducted at approximately 300 to 450° C. After this, the second treatment step, for example, a spike annealing operation referred to as step 220, is conducted on the tantalum pentoxide dielectric layer 104. The spike annealing operation is conducted in an oxygen or a nitrogen monoxide or a nitrogen dioxide atmosphere at approximately 1000 to 1200° C. for 1 to 2 seconds, with the temperature ramping at a rate of 50 to 250° C. per second. Concurrently, the remaining carbons in the tantalum pentoxide dielectric layer are removed to further increase the purity of the tantalum pentoxide dielectric layer. Since the duration of the second treatment step only lasts for 1 to 2 seconds, the silicon oxide formed on the surface of the polysilicon storage electrode is negligible and can be ignored.

After the above two-step treatment process, not only is the tantalum pentoxide dielectric layer is purified, but it also attains the crystalline state.

The present invention comprises at least the following advantages. Since the silicon oxide formed between the tantalum pentoxide dielectric layer and the polysilicon storage electrode can be ignored in the present invention, the dielectric constant of the dielectric layer for the capacitor formed according to the present invention approaches the maximum value of 25. Furthermore, a two-step treatment process is conducted on the tantalum pentoxide dielectric layer, wherein a lower operational temperature for the remote oxygen plasma treatment step and a shorter time duration for the spike annealing process together lower the thermal budget in the dielectric layer manufacturing process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method of a dielectric layer for a dynamic random access memory capacitor, comprising the steps of:

providing a substrate with a polysilicon storage electrode formed on the substrate;

covering the polysilicon storage electrode with a tantalum pentoxide dielectric layer;

conducting a remote oxygen plasma treatment on the tantalum pentoxide dielectric layer; and conducting a spike annealing process on the tantalum pentoxide dielectric layer after the remote oxygen plasma treatment is conducted, wherein the spike annealing process is conducted at a higher temperature than the remote oxygen plasma treatment, and a duration of the spike annealing process is short enough to substantially eliminate oxide layer formation on the polysilicon storage electrode of the capacitor.

2. The fabrication method of a dielectric layer for a dynamic random access memory capacitor according to claim 1, wherein the tantalum pentoxide layer is formed by methods including chemical vapor deposition.

3. The fabrication method of a dielectric layer for a dynamic random access memory capacitor according to claim 1, wherein the remote oxygen plasma treatment is conducted at approximately 350 to 500° C. for about 30 to 120 seconds.

4. The fabrication method of a dielectric layer for a dynamic random access memory capacitor according to claim 1, wherein the spike annealing process is conducted at about 1000 to 2000° C. for approximately 1 to 2 seconds, and the temperature is ramped at a rate of approximately 50 to 250° C. per second.

5. The fabrication method of a dielectric layer for a dynamic random access memory capacitor according to claim 4, wherein the spike annealing process is conducted in an oxygen atmosphere.

6. The fabrication method of a dielectric layer for a dynamic random access memory capacitor according to claim 4, wherein the spike annealing process is conducted in a nitrous oxide atmosphere.

7. A fabrication method of a dielectric layer of a dynamic random access memory capacitor, comprising the steps of:

providing a substrate with a polysilicon storage electrode formed on the substrate;

covering the polysilicon storage electrode with a tantalum pentoxide dielectric layer;

conducting an ultraviolet light-ozone treatment on the tantalum pentoxide dielectric layer; and conducting a spike anneal treatment on the tantalum pentoxide dielectric layer after the ultraviolet-ozone treatment is conducted, wherein the spike annealing process is conducted at a higher temperature than the ultraviolet light-ozone treatment, and a duration of the spike annealing process is short enough to substantially eliminate oxide layer formation on the polysilicon storage electrode of the capacitor.

8. The fabrication method of a dielectric layer of a dynamic random access memory capacitor according to claim 7, wherein the tantalum pentoxide dielectric layer is formed by methods including chemical vapor deposition.

9. The fabrication method of a dielectric layer for a dynamic random access memory capacitor according to claim 7, wherein the ultraviolet light-ozone treatment process is conducted at approximately 300 to 450° C.

10. The fabrication method of a dielectric layer for a dynamic random access memory capacitor according to claim 7, wherein the spike annealing process is conducted at a temperature of about 1000 to 2000° C. for approximately 1 to 2 seconds, and the temperature is ramped at a rate of approximately 50 to 250° C. per second.

11. The fabrication method of a dielectric layer for a dynamic random access memory capacitor according to claim 10, wherein the spike annealing process is conducted in an oxygen environment.

12. The fabrication method of a dielectric layer of a dynamic random access memory capacitor according to claim 7, wherein the spike annealing process is conducted in a nitrous oxide environment.

* * * * *